United States Patent [19]

Brown

[11] 4,080,552
[45] Mar. 21, 1978

[54] HYBRID BLOCKING OSCILLATOR FOR AN ELECTROMAGNETIC FUEL PUMP

[75] Inventor: Ralph V. Brown, Cayuta, N.Y.
[73] Assignee: Facet Enterprises, Inc., Tulsa, Okla.
[21] Appl. No.: 725,894
[22] Filed: Sep. 22, 1976
[51] Int. Cl.² .............................................. H02K 33/00
[52] U.S. Cl. .................... 318/128; 417/417; 318/132; 331/116 M
[58] Field of Search ................ 318/114, 119, 122–132; 417/416–418; 331/146, 116 M, 116 R, 157; 310/30, 34, 38

[56] References Cited
U.S. PATENT DOCUMENTS

| 2,831,114 | 4/1958 | Van Overbeck | 318/132 X |
| 2,962,643 | 11/1960 | Kwartiroff et al. | 318/132 |
| 3,381,616 | 5/1968 | Wertheimer et al. | 417/417 |
| 3,629,674 | 12/1971 | Brown | 318/128 |
| 3,911,337 | 10/1975 | Gerum | 318/130 |

*Primary Examiner*—Donovan F. Duggan
*Attorney, Agent, or Firm*—Remy J. VanOphem

[57] ABSTRACT

A hybrid blocking oscillator for an electromagnetic fuel pump is disclosed herein. The blocking oscillator embodies a temperature regulated bias control and two current dissipators for controlled dissipation of the currents induced in the solenoid and detection coils when the oscillator is in a blocked state. The disclosed hybrid circuit is capable of 5,000 hours of operation with a 99 percent reliability.

3 Claims, 3 Drawing Figures

HYBRID BLOCKING OSCILLATOR FOR AN ELECTROMAGNETIC FUEL PUMP

BACKGROUND OF THE INVENTION

1. Field of the Invention

The present invention relates to a blocking oscillator adapted for switching inductive loads and more particularly to a hybrid blocking oscillator circuit capable of surviving 5,000 hours with over 90% reliability.

2. Description of the Prior Art

Electromagnetic fluid pumps are used for a wide variety of applications including supplying fuel to internal combustion engines. As a result they are required to operate over a wide range of temperatures and endure relatively large voltage fluctuations. Since the operation of the engine requires a dependable fuel supply for starting and continued operation, the fuel pump and its associated electronic circuitry must be reliable and trouble free.

Disclosed herein is an improved blocking oscillator of the type generally disclosed in my prior U.S. Pat. No. 3,629,674 (Dec., 1971) and H. P. Wertheimer et al., U.S. Pat. No. 3,381,616 (May, 1968) which has a higher tolerance to voltage fluctuations and a longer life than realized with the earlier blocking oscillators.

SUMMARY OF THE INVENTION

The present invention contemplates an electromagnetic fluid pump having a solenoid coil driving a reciprocating piston member. The solenoid coil has an input terminal receiving power from a source of electrical power and an output terminal. A power amplifier connected in series relationship with the solenoid coil controls the current flow therethrough. The power amplifier has an emitter connected to the output terminal of the solenoid coil, a base and a collector.

A detection coil magnetically coupled to the solenoid provides a control bias signal to the base of the power amplifier driving the power amplifier to saturation when the current flow through the solenoid coil is increasing and turning off the power amplifier when current flow through the solenoid coil is decreasing. The detection coil has an input terminal connected to the output terminal of the solenoid coil and an output terminal connected to the base of the power amplifier through a first resistance, a second resistance and a third resistance connected in series relationship. A bias resistance is connected in series with the first and second resistance between the output terminal of the detection coil and the collector of the power amplifier. The series connected first and second resistance and the bias resistance form a voltage divider providing a bias potential at the base of the power amplifier.

A thermistor connected in parallel with the second resistance varies the potential at the base of the power amplifier as a function of the ambient temperature to assure starting of the blocking oscillator in cold weather. A Zener diode is connected between the output terminal of the detection coil and the collector of the power amplifier in parallel circuit relationship with the voltage divider comprising the first resistance, second resistance and the bias resistance and controls the maximum voltage that may be applied across the voltage divider.

A first series connected resistance and diode are connected in parallel with the solenoid coil to dissipate the energy of the collapsing magnetic field in the solenoid coil when the power amplifier is turned off and provides a controlled discharge so that the voltage induced by the collapsing magnetic field is significantly reduced. A second series connected resistance and diode are connected in parallel with the series connected solenoid coil and detection coil to provide a controlled dissipation of the current induced in the series connected solenoid coil and detection coil. A capacitance is connected in parallel with the series connected solenoid coil and power amplifier to suppress the radio frequency interference signals generated as the power amplifier is switched between its saturated state and its turned off state.

It is an object of the present invention to provide a solid state circuit for an electromagnetic fluid pump in which circuit reliability is greatly increased in which the transistor is protected from excessive voltage transients.

It is a further object of the present invention to provide a transistor oscillator circuit for an electromagnetic fluid pump having a Zener diode disposed between the transistor base and collector as well as a series connected resistance and diode in parallel circuit relationship with solenoid coil and the detection coil to protect the transistor against voltage breakdown.

It is a still further object of the invention to provide a temperature compensated transistor oscillator for an electromagnetic fluid pump which has greater fluid output in its pressure range than prior art pumps over the full range of ambient temperatures.

The foregoing and other additional objects and advantages of the present invention will appear hereafter from a reading of the detailed description which follows, taken together with the accompanying drawings wherein the preferred embodiment of the present invention is illustrated. It is to be expressly understood, however, that the drawings are for the purpose of illustration and description and are not to be construed as defining the limits of the invention.

DETAILED DESCRIPTION OF THE PREFERRED EMBODIMENT

Figure 1:
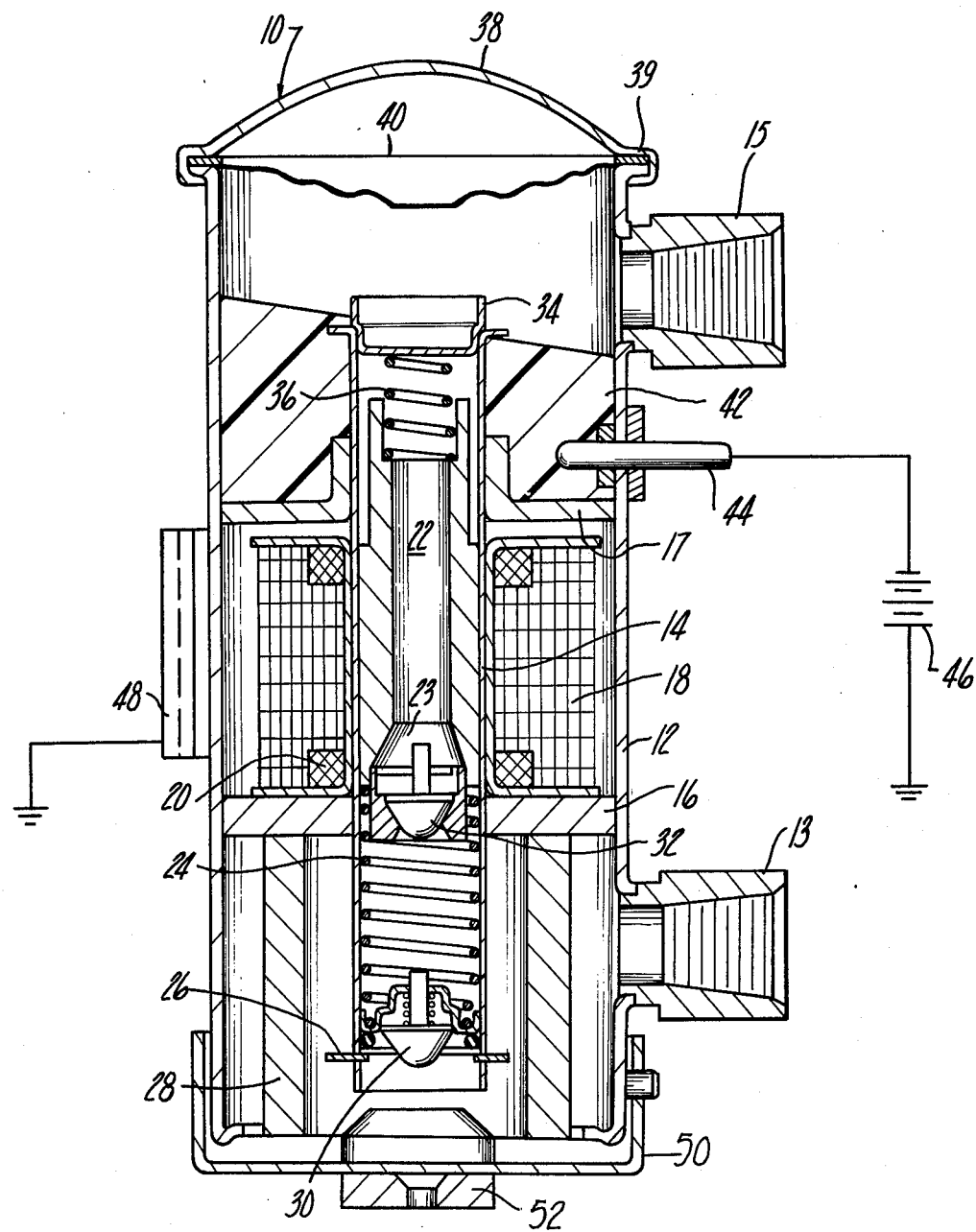
FIG. 1 shows a sectional view of an electromagnetic pump embodying the present invention.

Turning first to FIG. 1, the numeral 10 indicates generally an electromagnetic fluid pump having a generally cylindrical housing 12 with a fluid inlet 13 and fluid outlet 15. Contained within the housing 12 is a guide or cylinder member 14 which is supported within the housing by pole members or annuli 16 and 17. Disposed intermediate the pole members 16 and 17 are a solenoid coil 18 and detection coil 20 which are disposed coaxially with the guide member 14 and with a reciprocating piston member 22 which moves reciprocally within guide member 14. A spring member 24 is compressively confined between a lock ring 26 at one end of the guide member 14 and one transverse end of the piston member 22. A filter member 28 is disposed intermediate the fluid inlet 13 and the inlet 23 to the piston member. A plurality of valves 30 and 32 are disposed in the fluid path through the guide member 14 to prevent fluid flow other than unidirectional fluid flow from the inlet to outlet through the piston member 22 in the well known manner.

At the upper end of the piston member 22 is disposed an abutment member 34 which compressively confines a spring member 36 intermediate the piston 22 and the abutment member 34 for providing a cushion for the piston member when it reaches the top of its stroke. A cap member 38 is clamped or otherwise fitted around the housing 12 as shown in 39 to provide a fluid-tight seal. A diaphragm 40 is rigidly attached to the rim of the cap 38, as shown at 39, so that the interior of cap 38 constitutes a hermetically-sealed chamber which chamber suppresses the peak fluid pressure pulses encountered during operation.

An epoxy or other moldable material 42 aids in holding the various parts in position and may be useful in holding various electrical components inside the housing. Terminal 44 receives electrical power from a source of electrical power illustrated as battery 46. Alternatively, the source of electrical power may be an engine driven alternator or generator as is normally associated with the engine to which the electromagnetic pump is supplying fuel. The other terminal of the source of electrical power is connected to a common ground which is connected to the electromagnetic fluid pump through a mounting bracket 48. A bolt or nut member 52 is fastened to the bottom cap 50 to permit servicing of the filter 28.

Figure 2:
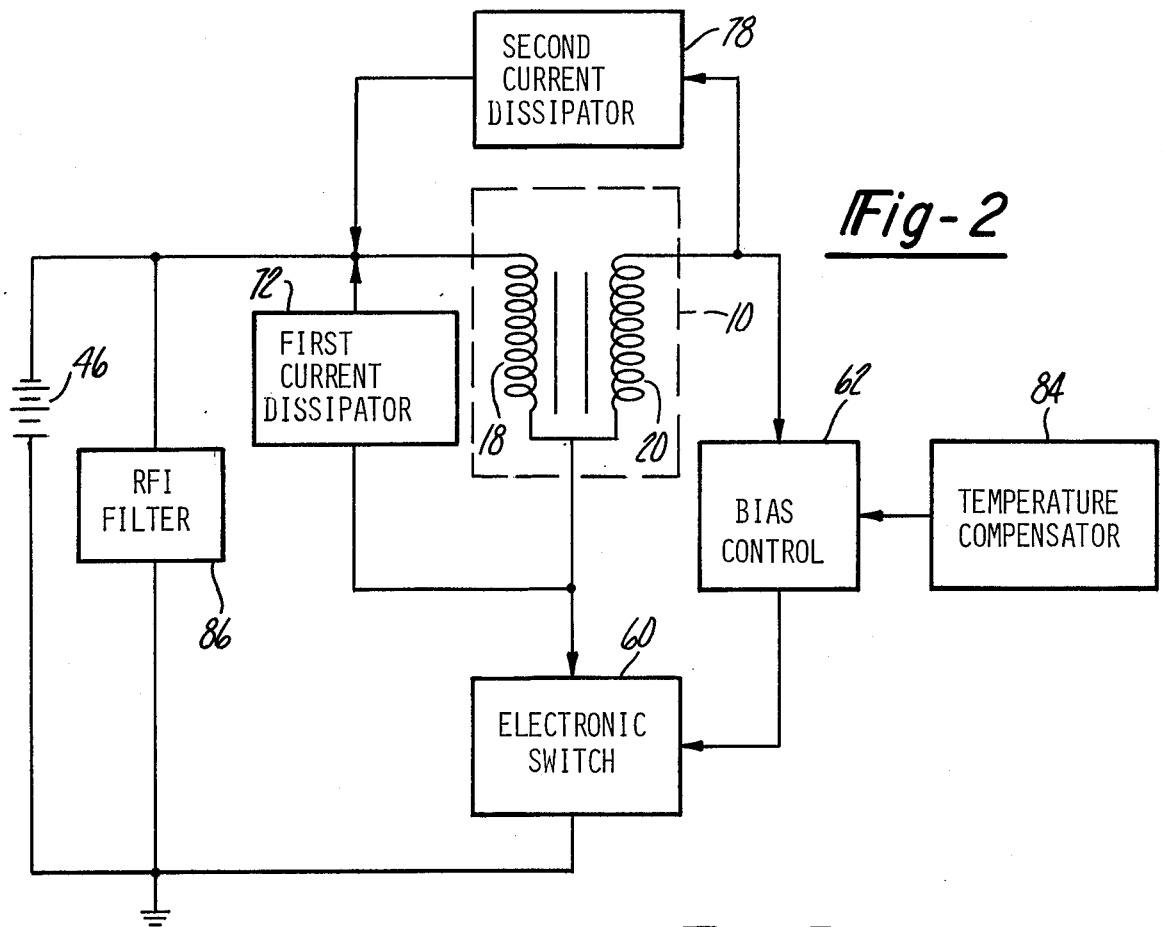
FIG. 2 is a block diagram showing the basic functional elements of the disclosed circuit for the electromagnetic pump.

Turning now to the block diagram shown in FIG. 2, the electromagnetic fluid pump dashed box 10 receives electrical power from the source of electrical power 46 through feedthrough 44. The electromagnetic fuel pump embodies serially connected solenoid coil 18 and a detection coil 20 as shown. The junction between the solenoid coil 18 and the detection coil 20 is connected to an electronic switch 60 which controls the current flow through solenoid coil 18 to the opposite terminal of the source of electrical power 46 through bracket 48. A current flow in the solenoid coil 18 induces a signal in detection coil 20 which is transmitted to a bias control 62 which generates a bias signal controlling the state of electronic switch 60. A temperature compensator 84 responds to ambient temperatures and generates a signal controlling the bias signal generated by the bias control 62 as a function of the ambient temperature. A first current dissipator 72 is connected across opposite terminals of the solenoid coil 18 and dissipates the current induced in the solenoid coil 18 when the electronic switch 60 is switched to the nonconducting or "off" state in response to a bias signal received from the bias control 62. A second current dissipator 78 is connected across the input terminal of solenoid coil 18 and the output terminal of detection coil 20 and dissipates the current induced in the serially connected solenoid and detection coils, 18 and 20, respectively, when the current flow in the solenoid 18 is terminated when the electronic switch is switched to its "off" state. A radio frequency interference filter 86 is connected between feedthrough 44 and the output of electronic switch 60.

Figure 3:
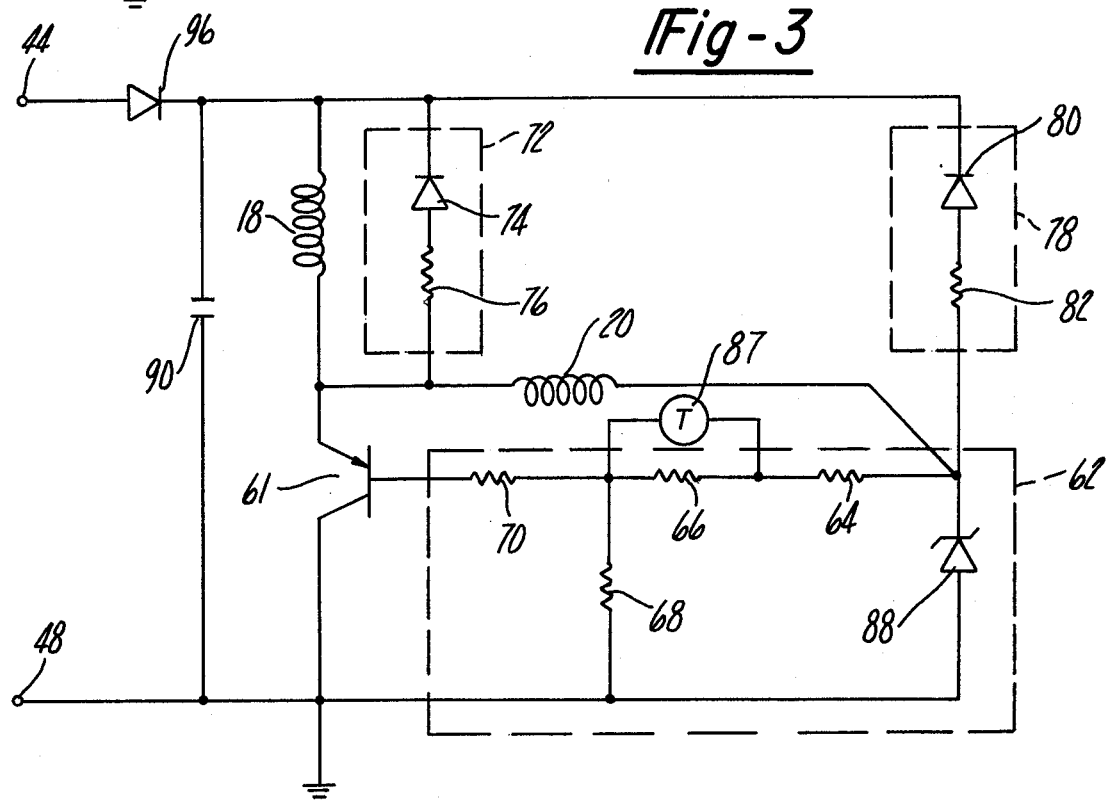
FIG. 3 is a circuit diagram of the solid state blocking oscillator.

Referring now to the circuit diagram shown in FIG. 3, a diode 96 is connected between the feedthrough 44 and the input terminal of solenoid coil 18. The output terminal of solenoid coil 18 is connected to the emitter of transistor 61 which comprises the electronic switch 60 to one end of a resistance 76 and the input of detection coil 20. Diode 74 is connected between resistance 76 and the input terminal of solenoid coil 18. Series connected resistance 76 and diode 74 comprise the first current dissipator 72. The other end of detection coil 20 is connected to resistance 82, resistance 64 and Zener diode 88. A diode 80 is connected between resistance 82 and the input terminal of solenoid coil 18. Series connected resistance 82 and diode 80 comprise the second current dissipator 78.

Resistances 64, 66 and 70 are connected in series between detection coil 20 and the base of transistor 61. Resistance 68 is connected between the junction between resistances 66 and 70 and the collector of transistor 61. A Zener diode 88 is connected to the junction between detection coil 20 and resistance 64 and the collector of transistor 61 in parallel with resistances 64, 66 and 68. Series connected resistance 64, 66 and 68 comprise a voltage divider network which controls the potential of the signal applied to the base of transistor 61 absent a signal being induced in detection coil 20. Zener diode 88 has a predetermined break over potential and regulates the maximum voltage that can be impressed across the voltage divider network. Resistance 64, 66, 68 and 70, and Zener diode 88 comprise the bias control 62. A thermistor 87 having a predetermined temperature coefficient is connected in parallel with resistance 66 and comprises the temperature compensator 84. A capacitor 90 is connected between the collector of transistor 61 and the input terminal of solenoid coil 18 and in combination with diode 96 comprises the RFI filter 86.

The operation of the circuit is as follow. Starting current from feedthrough 44 flows through diode 96 solenoid coil 18, detection coil 20, and resistances 64, 66 and 68. The potential at the junction between resistances 66 and 68 is applied to the base of transistor 61 through resistance 70. This potential is lower than the potential at the emitter of transistor 61 and forward biases transistor 61 into the conductive state. Conduction of transistor 61 increases the current flow in solenoid coil 18 which, in turn, induces a current flow in detection coil 20 counter to the starting current flow which further lowers the potential at the base of transistor 61 and further increases the conductance of transistor 61. This process continues until transistor 61 is completely saturated, i.e., turned "on". The current flow through solenoid coil 18 generates a magnetic field retracting the piston 22 against the force of spring member 24. When transistor 61 saturates the generated magnetic field becomes static and terminates the induced current flow in the detection coil 20. In the saturated state, the emitter of transistor 61 is near ground potential. Upon termination of the induced current flow in detection coil 20, the potential at the base of transistor 61 rises back toward the start potential causing the base current to start decreasing. This in turn starts to turn transistor 61 "off" which decreases the current flow in solenoid coil 18 and the magnetic field starts to collapse, which induces a current in the detection coil which is in the same direction as the start current. The induced current flows through the voltage divider network further increasing the potential at the base of transistor 61 turning it "off" still further. This continues and quickly transistor 61 is turned "off" returning the circuit to the start conditions.

The series connected resistance 76 and diode 74 dissipate in a controlled manner the current induced in the solenoid coil 18 when transistor 61 is turned off quickly by the action of the circuit. Series connected resistance 82 and diode 80 also dissipates a portion of the current induced in the detection coil 20 when the transistor 61 is turned "off". The Zener diode 88 limits the maximum potential that may be applied between the base and collector of transistor 61. Thermistor 86 in parallel with resistance 66 increases the resistance of the voltage divider network and lowers the potential at the base of transistor 61 generated by the start current to insure starting at cold temperatures. Capacitance 90 in combination with diode 96 filters transient voltage fluctuations which occur across the input terminal of solenoid coil 18 and transistor 61 due to the switching on and off of transistor 61.

Although a specific circuit has been illustrated and described herein, it is not intended that the invention be limited to the elements and the circuit arrangement disclosed. One skilled in the art will recognize the particular elements or subcircuits may be changed without departing from the spirit of the invention.

What is claimed is:

1. An electromagnetic fluid pump comprising:
a pump having a solenoid coil generating a magnetic field in response to a current flow therethrough, a detection coil connected in a series relationship with and magnetically linked to said solenoid coil generating an induced signal when the current flow in said solenoid coil is changing, a reciprocating piston member movable in response to the magnetic field generated by said solenoid coil and valve means for providing a unidirectional fluid flow through said pump in response to the reciprocating movement of said piston member;
electronic switch means connected in series relationship with said solenoid coil for controlling a current flow therethrough;
a bias control means in series relationship with said solenoid coil and said detection coil for generating a bias control signal controlling the current flow through said electronic switch in response to said induced signal, said bias control means further generating a predetermined bias control signal when the current flow through said solenoid coil is static;
temperature compensation means for generating a temperature compensation signal controlling the value of said predetermined bias control signal and said bias control signl as a function of the ambient temperature to insure starting and continued operation of said electronic switch at low ambient temperatures;
first current dissipator means connected in parallel with said solenoid coil for dissipating the current induced therein by the collapsing magnetic field when the electronic switch is turned off, terminating a current flow through said solenoid coil;
second current dissipator means connected in parallel with said serially connected solenoid coil and said detection coil for dissipating the current induced in said solenoid and said detection coils by the collapsing magnetic field when said electronic switch is turned off; and
radio frequency interference filter means connected between said serially connected solenoid coil and electronic switch for surpressing transient voltage fluctuations generated by the collapsing magnetic field when the electronic switch is turned off.

2. The electromagnetic fluid pump of claim 1 wherein said electronic switch is a transistor having an emitter connected to one end connected to said solenoid coil, a base, and an emitter, said bias control means comprises:
a first resistance having one end connected to one end of said detection coil and receiving said induced signal; and an opposite end;
a second resistance having one end connected to the opposite end of said first resistance and in series relation therewith, and an opposite end;
a third resistance having one end connected to the opposite end of said second resistance and the opposite end connected to the collector of said transistor;
a fourth resistance having one end connected to the junction between said second and third resistances and an opposite end connected to the base of said transistor; and
a Zener diode having a predetermined crossover potential and connected in parallel with said first, second and third resistances, said Zener diode having an anode connected to the junction between said detection coil and said first resistance and a cathode connected to the collector of said transistor; and
wherein said temperature compensating means is a thermistor connected in parallel with said second resistance.

3. A blocking oscillator for an electromagnetic actuator having a serially connected solenoid coil generating a magnetic field in response to a current flow therethrough, and a detection coil magnetically linked to the solenoid coil generating a signal in response to a change in the magnetic field generated by the solenoid coil, comprising:
a transistor controlling the current flow through the solenoid coil, said transistor having an emitter connected to the junction between the solenoid coil and the detection coil, a base, and a collector;
a series connected first, second and third resistance connected between the end of the detection coil opposite the end connected to the solenoid coil and the collector of said transistor;
a thermistor connected in parallel circuit relationship with said second resistance;
a Zener diode connected in parallel circuit relationship with said series connected first, second and third resistance;
a fourth resistance connected between the junction of said second and third resistance and the base of said transistor;
a first serially connected resistance and diode connected in parallel circuit relationship with said solenoid coil to dissipate the current induced in said solenoid coil by a collapsing magnetic field;
a second serially connected resistance and diode connected in parallel circuit relationship with said serially connected solenoid and detection coils to dissipate the currents induced in said solenoid and detection coils by a collapsing magnetic field; and
a capacitance connected in parallel circuit relationship between the end of the solenoid coil opposite the end connected to the detection coil and the collector of said transistor.

* * * * *

UNITED STATES PATENT OFFICE
CERTIFICATE OF CORRECTION

Patent No. 4,080,552             Dated    March 21, 1978

Inventor(s)   Ralph V. Brown

It is certified that error appears in the above-identified patent and that said Letters Patent are hereby corrected as shown below:

Column 4, line 30, delete the word "follow" and insert the word ----follows----.

Column 4, line 31, after the numeral "96" insert a comma.

Column 6, line 7, after the word "signal" delete the semicolon and insert a comma.

Signed and Sealed this

Fifteenth Day of August 1978

[SEAL]

Attest:

RUTH C. MASON
Attesting Officer

DONALD W. BANNER
Commissioner of Patents and Trademarks